(12) United States Patent
Duong et al.

(10) Patent No.: US 10,816,180 B2
(45) Date of Patent: Oct. 27, 2020

(54) SYSTEMS AND METHODS FOR LIGHTING FIXTURES

(71) Applicant: Fluence Bioengineering, Inc., Austin, TX (US)

(72) Inventors: Dung Duong, Austin, TX (US); Randy Johnson, Austin, TX (US); Nick Klase, Austin, TX (US)

(73) Assignee: Fluence Bioengineering, Inc., Austin, TX (US)

( * ) Notice: Subject to any disclaimer, the term of this patent is extended or adjusted under 35 U.S.C. 154(b) by 0 days.

(21) Appl. No.: 16/542,442

(22) Filed: Aug. 16, 2019

(65) Prior Publication Data

US 2019/0368708 A1 Dec. 5, 2019

Related U.S. Application Data

(63) Continuation of application No. 15/697,149, filed on Sep. 6, 2017, now Pat. No. 10,436,428.

(Continued)

(51) Int. Cl.
*F21V 23/00* (2015.01)
*H05K 1/05* (2006.01)
*H05K 1/18* (2006.01)
*H05K 1/02* (2006.01)
*H05K 3/32* (2006.01)
(Continued)

(52) U.S. Cl.
CPC ............ *F21V 23/005* (2013.01); *A01G 7/045* (2013.01); *F21K 9/232* (2016.08); *F21K 9/90* (2013.01); *F21S 4/28* (2016.01); *F21V 7/005* (2013.01); *F21V 7/0066* (2013.01); *F21V 7/05* (2013.01); *F21V 15/015* (2013.01); *F21V 17/107* (2013.01); *F21V 19/003* (2013.01); *F21V 19/0015* (2013.01); *F21V 23/001* (2013.01); *F21V 23/02* (2013.01); *F21V 23/0442* (2013.01); *F21V 29/70* (2015.01); *F21V 29/74* (2015.01); *F21V 29/83* (2015.01); *H05K 1/0203* (2013.01); *H05K 1/0209* (2013.01); *H05K 1/0274* (2013.01); *H05K 1/0277* (2013.01); *H05K 1/05* (2013.01); *H05K 1/056* (2013.01); *H05K 1/181* (2013.01); *H05K 1/182* (2013.01); *H05K 1/185* (2013.01); *H05K 3/0014* (2013.01); *H05K 3/28* (2013.01); *H05K 3/32* (2013.01); *H05K 3/44* (2013.01); *F21Y 2103/10* (2016.08); *F21Y 2105/16* (2016.08); *F21Y 2115/10* (2016.08); *H05B 45/10* (2020.01); *H05B 47/105* (2020.01); *H05B 47/19* (2020.01); *H05K 2201/066* (2013.01); *H05K 2201/09009* (2013.01); *H05K 2201/10106* (2013.01)

(58) Field of Classification Search
CPC ....... F21V 21/30; F21V 21/26; F21Y 2105/10
See application file for complete search history.

(56) References Cited

U.S. PATENT DOCUMENTS

2008/0062689 A1\* 3/2008 Villard .................... F21V 19/02
362/249.07
2010/0177514 A1\* 7/2010 Liu ......................... F21V 29/75
362/235

(Continued)

*Primary Examiner* — Evan P Dzierzynski
(74) *Attorney, Agent, or Firm* — Yutian Ling

(57) ABSTRACT

Examples of the present disclosure are related to systems and methods for lighting fixtures. More particularly, embodiments disclose lighting fixtures utilizing metal core PCB (MCPCB) for thermal, mechanical, and/or optical controls.

12 Claims, 6 Drawing Sheets

Related U.S. Application Data

(60) Provisional application No. 62/516,412, filed on Jun. 7, 2017.

(51) Int. Cl.

| | |
|---|---|
| *F21K 9/90* | (2016.01) |
| *F21V 29/74* | (2015.01) |
| *F21V 23/04* | (2006.01) |
| *F21V 29/70* | (2015.01) |
| *F21V 29/83* | (2015.01) |
| *F21K 9/232* | (2016.01) |
| *A01G 7/04* | (2006.01) |
| *F21V 7/00* | (2006.01) |
| *F21V 7/05* | (2006.01) |
| *H05K 3/00* | (2006.01) |
| *H05K 3/28* | (2006.01) |
| *H05K 3/44* | (2006.01) |
| *F21S 4/28* | (2016.01) |
| *F21V 15/015* | (2006.01) |
| *F21V 17/10* | (2006.01) |
| *F21V 19/00* | (2006.01) |
| *F21V 23/02* | (2006.01) |
| *F21Y 115/10* | (2016.01) |
| *H05B 45/10* | (2020.01) |
| *H05B 47/19* | (2020.01) |
| *H05B 47/105* | (2020.01) |
| *F21Y 105/16* | (2016.01) |
| *F21Y 103/10* | (2016.01) |

(56) References Cited

U.S. PATENT DOCUMENTS

| | | | |
|---|---|---|---|
| 2015/0219328 A1* | 8/2015 | Lee | F21K 9/233 |
| | | | 362/235 |
| 2016/0003453 A1* | 1/2016 | Klase | F21S 8/066 |
| | | | 362/220 |

* cited by examiner

SYSTEMS AND METHODS FOR LIGHTING FIXTURES

CROSS-REFERENCE TO RELATED APPLICATIONS

This application is a continuation of U.S. patent application Ser. No. 15/697,149, entitled "Systems and methods for lighting fixtures," and filed Sep. 6, 2017, which claims priority under 35 U.S.C. § 119 to Provisional Application No. 62/516,412 filed on Jun. 7, 2017, each of which is fully incorporated herein by reference in their entirety.

BACKGROUND INFORMATION

Field of the Disclosure

Examples of the present disclosure are related to systems and methods for lighting fixtures. More particularly, embodiments disclose lighting fixtures utilizing bends in metal-core PCB (MCPCB) and orthogonal braces for thermal, mechanical, and/or optical controls.

Background

Controlled environment agriculture, especially vertical farming is becoming more prevalent in the US and around the world. Vertical farming relies on light fixtures to illuminate a plant canopy. The light fixtures uniformly distribute radiant flux over the plant canopy, while removing heat from light sources (typically LEDs). The light fixtures' efficacy and cost directly impacts the operational expenses associated with vertical farming. As fixture height directly influences a number of vertical layers within a growth volume, it is important to minimize a form factor or vertical height of the fixture Operating higher-powered lights in a vertical growth is more costly than utilizing free sunlight in greenhouses or field-grown. To overcome these costs, vertical farming must have an increased yield, shorter growth cycles, more consistent product, less water usage, farm to plate timeframe, high nutrient content, and other tangible advantages.

Although light emitting diodes (LEDs) used in vertical farming are more efficient than traditional higher-powered lights, their manufacturing costs are also higher. Additionally, their performance is negatively impacted with thermal rise. The terminal rise requires the light fixtures to dissipate heat more efficiently. This generated heat causes issues such as decreased longevity and lower fixture efficacy. To circumvent the requirements to dissipate the heat, some manufacturers have built complex LED fixtures. This has led to conventional LED fixtures being coupled to heat sinks.

This has led to conventional LED fixtures being coupled to heat sinks. Conventional LED fixtures utilize LEDs that are positioned on a printed circuit board. PCB substrates may be made of different materials such as FR4, Aluminum, copper, etc. In most application, an insulative substrate is necessary such as FR4. In higher power applications, a highly thermally conductive substrate is desired. For LEDs, thermal dissipation is paramount and therefore Aluminum substrates are often utilized. When metal is used as the substrate, the term metal core printed circuit board is used or more commonly MCPCB. The linear MCPCB is then coupled to the heatsink to dissipate the heat. The process leads to inefficient thermal transfer or increased thermal resistance between the heat source (LEDs) and the heatsink. This process to affix the LEDs to the MCPCB and then to couple the MCPCB to the heat sink requires time and resources. This can be an arduous, time consuming, and costly task.

Accordingly, needs exist for more effective and efficient systems and methods for light fixtures systems with supports that extend in a direction orthogonal to the bends of the heat sink.

SUMMARY

Embodiments disclosed herein describe systems and methods for a light fixture that utilizes MCPCB for thermal, mechanical, and/or optical controls. In embodiments, a MCPCB sheet may be directly populated with electronic components, such as LEDS, connectors, fuses, etc. The board may then be coated for protection. The MCPCB sheet may then be cut into a single panel. Next, the single panel MCPCB is bent at least one time, wherein the bend may increase the rigidity and mechanical strength of the system, be more aesthetically pleasing, and allow for thermal and optical controls. The bent MCPCB panel can then be assembled into a light fixture. The light fixture may include a plurality of bent panels that are coupled together via brackets.

The brackets may be configured to be positioned over a center portion of the bent panels. The positioning of the panels may be configured to give the system mechanical strength in a direction that is perpendicular to the bends in the panels, while also allowing multiple bent panels to be coupled together. Furthermore, electrical components may be configured to be positioned through, over, and/or embedded within the brackets to reduce the footprint, sizing, etc. of the system.

In embodiments, multiple brackets may be coupled together via a hinge. The hinge may allow for multiple sections of the system to be folded over itself while not in use, while sharing a same power supply when in use.

These, and other, aspects of the invention will be better appreciated and understood when considered in conjunction with the following description and the accompanying drawings. The following description, while indicating various embodiments of the invention and numerous specific details thereof, is given by way of illustration and not of limitation. Many substitutions, modifications, additions or rearrangements may be made within the scope of the invention, and the invention includes all such substitutions, modifications, additions or rearrangements.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
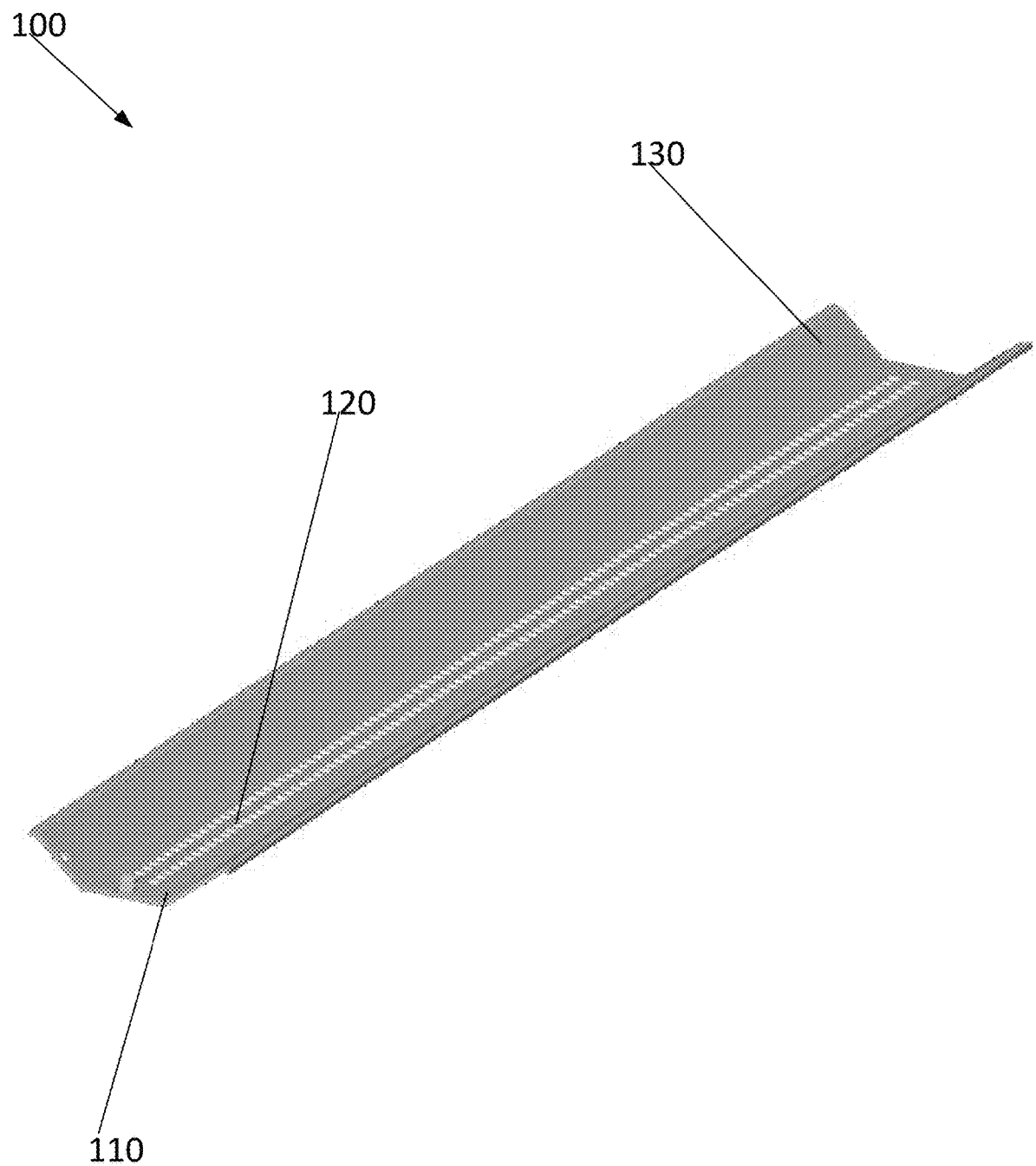
FIG. 1 depicts a light fixture, according to an embodiment.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help improve understanding of various embodiments of the present disclosure. Also, common but well-understood elements that are useful or necessary in a commercially feasible embodiment are often not depicted in order to facilitate a less obstructed view of these various embodiments of the present disclosure.

DETAILED DESCRIPTION

In the following description, numerous specific details are set forth in order to provide a thorough understanding of the present embodiments. It will be apparent, however, to one having ordinary skill in the art that the specific detail need not be employed to practice the present embodiments. In other instances, well-known materials or methods have not been described in detail in order to avoid obscuring the present embodiments.

FIG. 1 depicts a MCPCB LED bar system 100, according to an embodiment. System 100 may be configured to utilize bends in a MCPCB lighting fixture for thermal, mechanical, and optical controls. System 100 may include MCPCB 110, light sources 120, and bends 130. Utilizing bends 130, MCPCB 110 may be substantially isothermal having somewhat uniform temperatures across MCPCB 110.

MCPCB 110 may be formed of any metal, including: copper, 3003 AL, 5052 AL, and/or other desired metals. In specific implementations, MCPCB 110 may be formed of a metal or substrate with a very low emissivity. However such a system would be much larger than a system with a high emissivity platform. To increase the emissivity of the MCPCB 110, MCPCB 110 may be anodized, may have a solder mask that yields higher emissivity that anodized aluminum, and/or have a painted surface that yields higher emissivity than anodized aluminum. MCPCB 110 may be positioned in a panel having a longer longitudinal axis than a lateral axis. MCPCB 110 may have a thickness that is based on the thermal properties generated by light sources 120. For example, MCPCB 110 may have a thickness that is around 1.6 mm.

Light sources 120 may be light emitting diodes (LEDs) or any other device that is configured to emit light. Light sources 120 may be directly embedded or positioned on MCPCB 110, such that additional operations to affix tape or thermal adhesives to MCPCB 110, a heat sink, or both are not required. Light sources 120 may be positioned from a first end of MCPCB 110 to a second end of MCPCB 110. Light sources 120 may be configured to generate heat in response to creating and emitting light.

Bends 130 may be positioned from the first end to the second end of MCPCB 110. Bends 130 may be configured to add rigidity and/or mechanical strength to system 100, add form for aesthetics, operate as a heat sink to guide the flow of air, and allow for optical controls.

Figure 2:
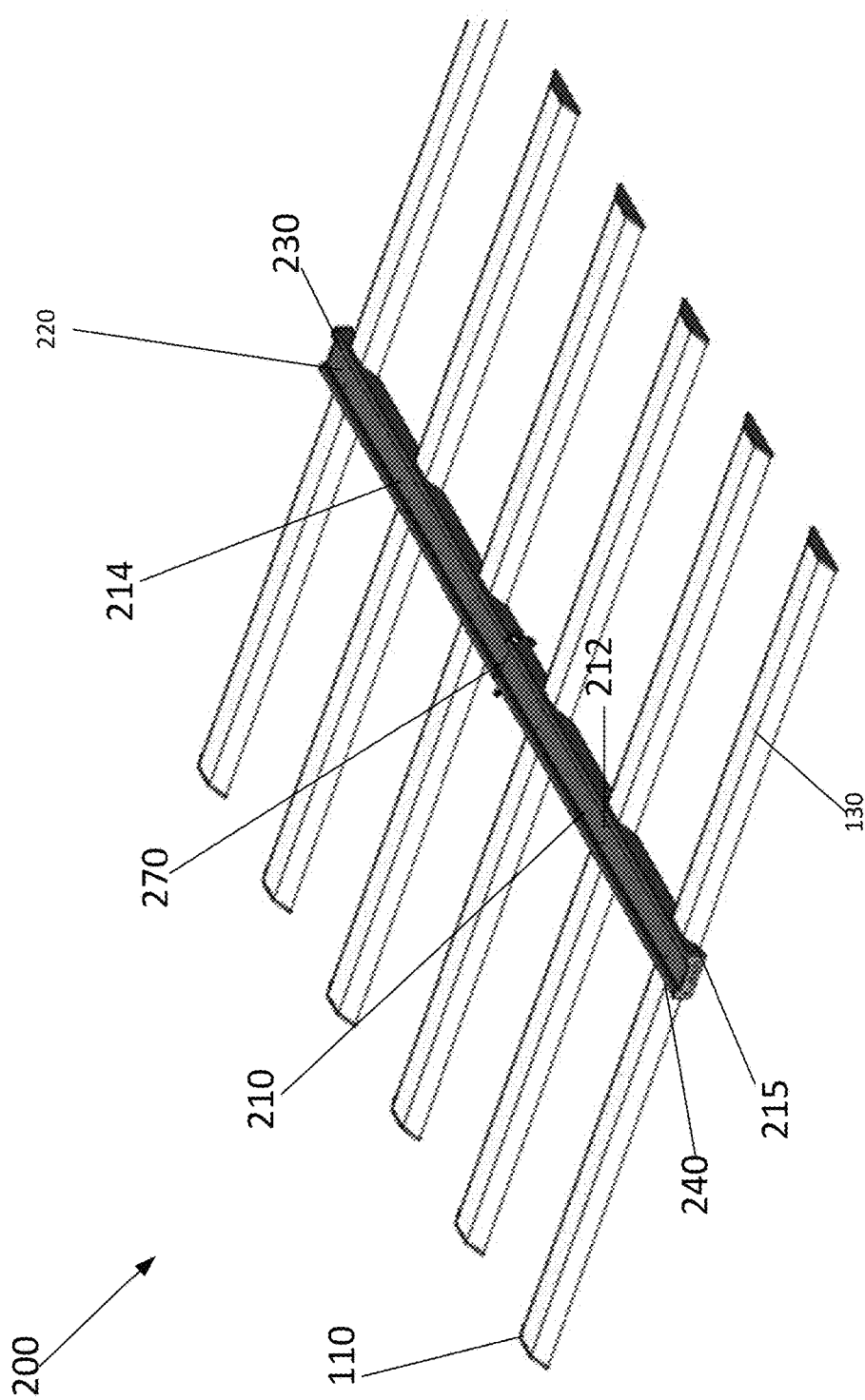
FIG. 2 depicts a light fixture according to an embodiment.

FIG. 2 depicts a MCPCB fixture 200, according to an embodiment. Elements depicted in FIG. 2 may be described above, and for the sake of brevity an additional description of these elements is omitted.

As depicted in FIG. 2, fixture 200 may include a plurality of bent MCPCBs 110, a first bracket 210, a second bracket 220, and hinge 270.

The plurality of bent MCPCBs 110 may be positioned in parallel with each other. However, in other embodiments, the plurality bent MCPCBs 110 may be askew from one another. The plurality of bent MCPCBs 110 may be positioned equidistance from adjacent bent MCPCBs 110. However, in other embodiments, the plurality of bent MCPCBs 110 may be positioned at different distanced from one another.

Brackets 210, 220 may be polymer or metal (al, steel) brackets, braces, support structures, etc. that are configured to a first set of bent MCPCBs 110 and a second set of bent MCPCBs 110 together, respectively. Brackets 210, 220 may be configured to be positioned orthogonal to the bends 130. By positioning brackets 210, 220 in a direction orthogonal to bends 130, brackets 210, 220 may supply mechanical rigidity and support to fixture 200 in a lateral axis of fixture 200. In embodiments, the first and second sets of bent MCPCBs 110 may have the same number of MCPCBs 110 or different numbers. Furthermore, the bent MCPCBs 110 in the groups may be the same or different sizes, with the same light sources or different light sources, may be symmetrical or asymmetrical with respect to each other, emit the same or different light patterns, etc. Accordingly, based on the characteristics between the first set of bent MCPCBs 110 and the second set of bent MCPCbs 110, the first and second sets may be configured to emit light patterns to the same and/or different light patterns over the different areas of interest.

Brackets 210, 220 may include cutouts 215, first rail 230, second rail 240, channel 214, and coupling orifices 212.

Cutouts 215 may be positioned on the lower surfaces of brackets 210, 220. Cutouts 215 may be configured to receive the upper surfaces of MCPCBs 110. In embodiments, cutouts 215 may be shaped to correspond with the upper surfaces of MCPCBs 110. Accordingly, when MCPCBs 110 are inserted into cutouts 215, the inner surfaces of cutouts 215 may be positioned adjacent to the upper surface of MCPCBs 110. This may form a continuous surface that allows heat to flow up and around the sidewalls of brackets 210, 220. Furthermore, when MCPCBs 110 are positioned within cutouts 215 the bottom surfaces MCPCBs 110 may be flush with the bottom surfaces of cutouts 215.

First rail 230 may be positioned on a first side of brackets 210, 220 and second rail 240 may be positioned on a second side of brackets 210, 220, wherein channel 214 may be positioned between first rail 230 and second rail 240. The upper ends of first rail 230 and second rail 240 may be vertically offset from the upper surface of channel 214. This may allow heat generated by the light sources to be channeled towards the longitudinal axis of brackets 210, 220, which may be orthogonal to the longitudinal axis of MCPCBs 110.

Channel 214 may extend between first rail 230 and second rail 240, wherein the upper surface of channel 214 is below the upper surfaces of first rail 230 and second rail 240. Channel 214 may include coupling orifices 212 that extend through the body of channel 214. The coupling orifices 212 may be configured to receive coupling mechanisms (i.e. screws, bolts, etc.) to couple MCPCBs 110 to brackets 210, 220.

Hinge 270 may be positioned between first bracket 210 and second bracket 220, wherein hinge 270 is configured to couple first bracket 210 and second bracket 220. Hinge 270 may be configured to allow fixture 200 to fold over itself along a longitudinal axis of brackets 210, 220. More specifically, hinge 270 may be configured to allow first bracket 210 to rotate relative to second bracket 220. This may allow first bracket 210 and second bracket 220 to be positioned in the same plane in a first mode when fully extended, and allow first bracket 210 and second bracket 220 to be positioned in two parallel planes in a second mode when fully collapsed. This may allow fixture 200 to have a smaller width during transportation and installation. In embodiments, hinge 270 may be positioned at a point that is in the center of the longitudinal axis of brackets 210, 220. This may allow system 200 to be symmetrical when folded or unfolded. It should be appreciated that system 200 may include more than one hinge. This would allow system 200 to be longer in length when system 200 is extended, and the same size when system 200 is collapsed around the hinges.

In embodiments, the coupling orifices 212 may also allow the brackets 210, 220 to be coupled to a support structure, such as a wall, ceiling, etc. Responsive to coupling a first bracket 210 to the support structure, the second bracket 220 may rotate while the first bracket remains fixed in place. This may allow the profile of system 200 to be reduced and/or altered when system 200 is affixed to the support structure. Furthermore, responsive to rotating the second bracket 220, the light pattern on an area of interest by light sources associated with first bracket 210 and second bracket may change based on the rotation.

Figure 3:
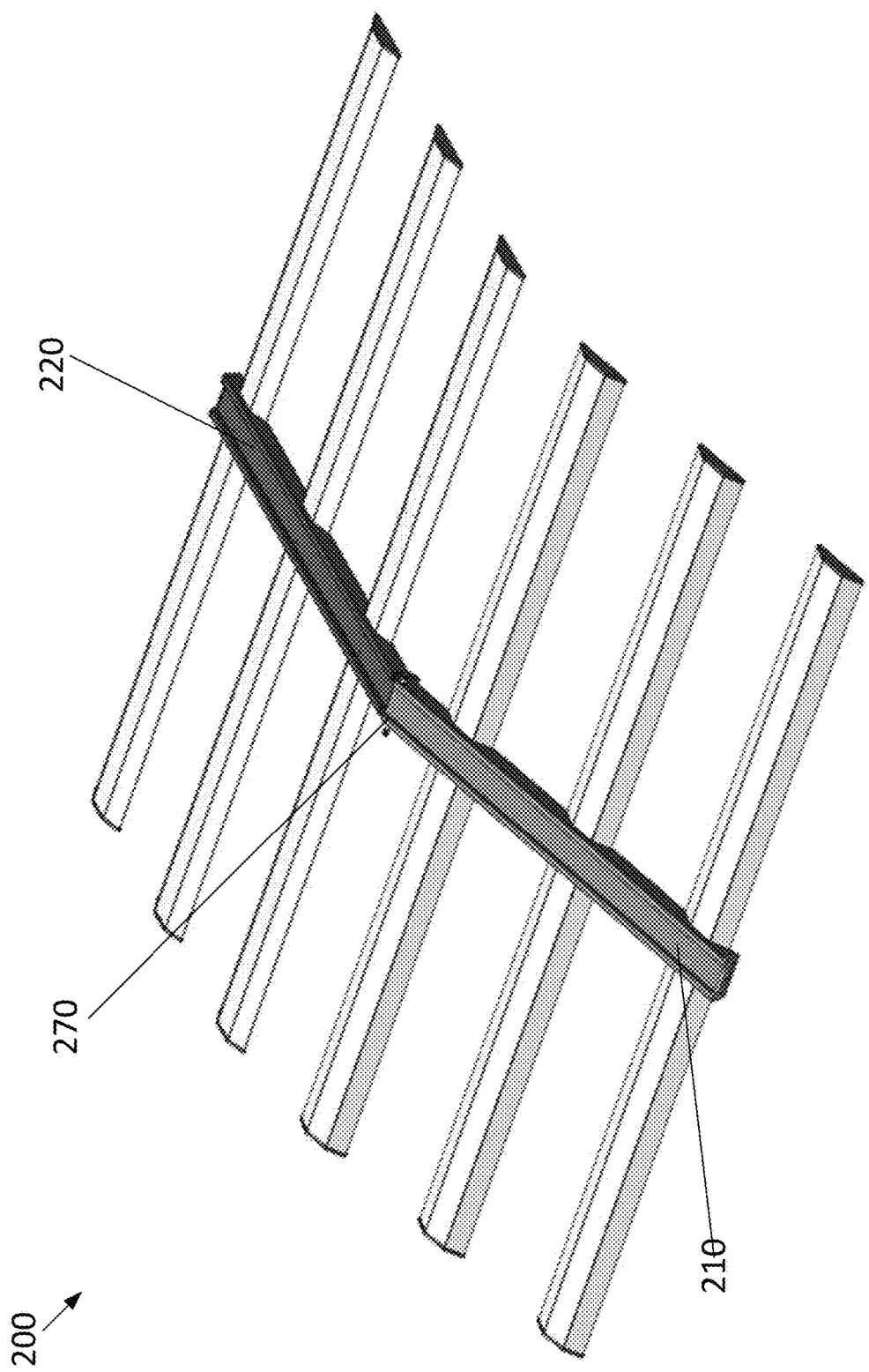
FIG. 3 depicts a light fixture, according to an embodiment.

FIG. 3 depicts a MCPCB fixture 200, according to an embodiment. Elements depicted in FIG. 3 may be described above, and for the sake of brevity an additional description of these elements is omitted.

As depicted in FIG. 3, hinge 270 may work as a mechanical bearing that allows first bracket 210 to rotate relative to second bracket 220. This may decrease the angle of system 200 to be below one hundred eighty degrees, but higher than ninety degrees.

Figure 4:
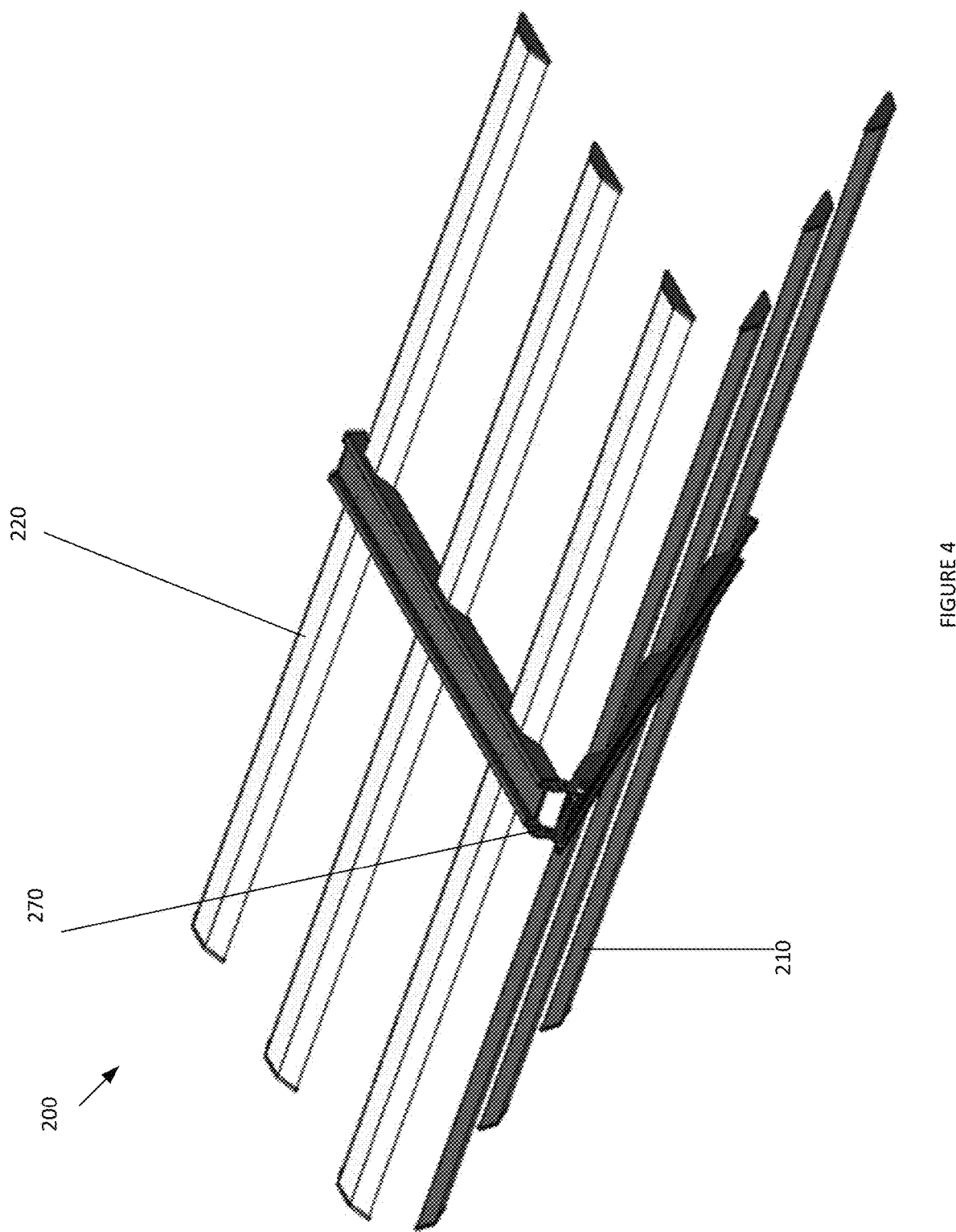
FIG. 4 depicts a light fixture, according to an embodiment.
Figure 5:
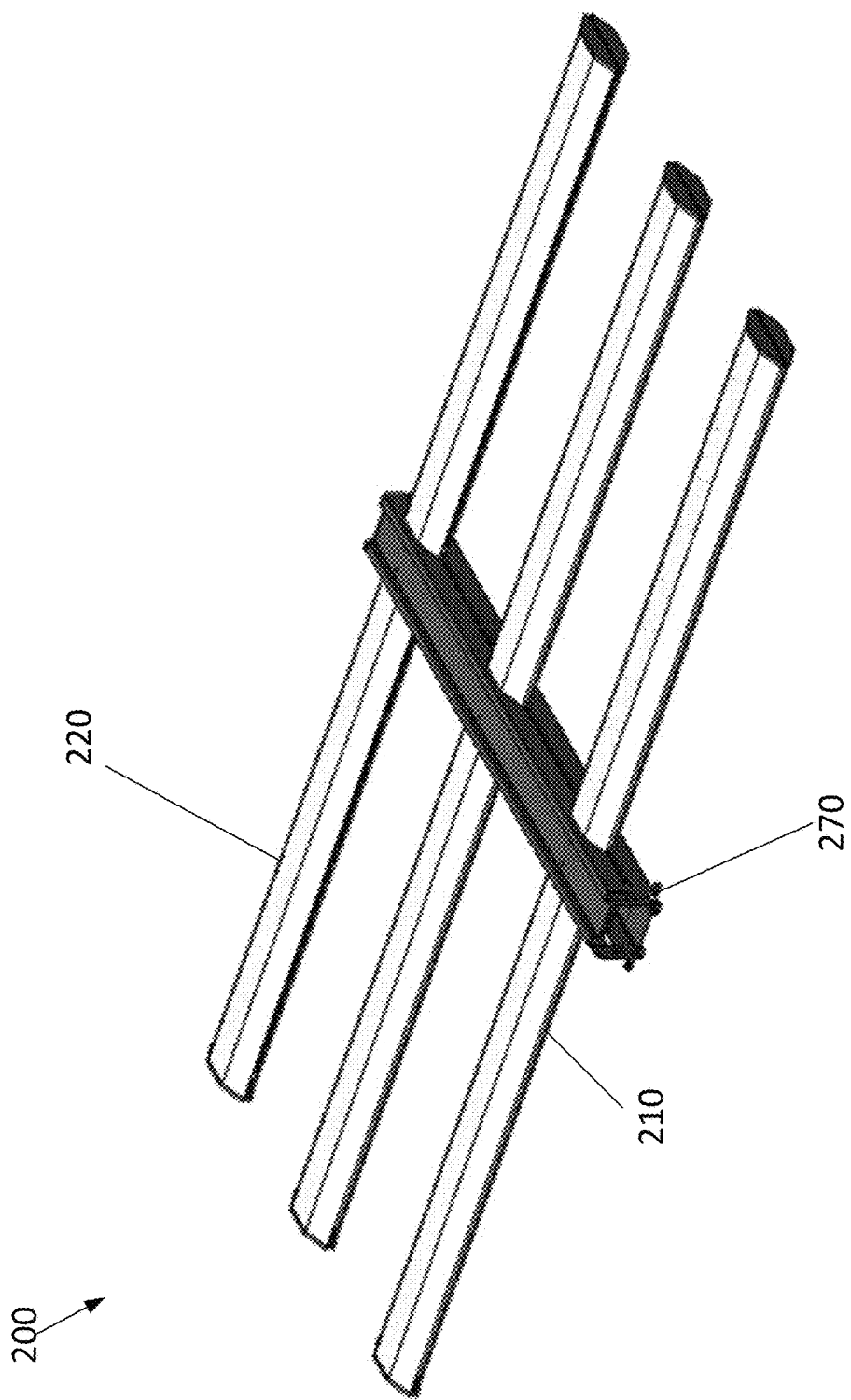
FIG. 5 depicts a light fixture, according to an embodiment.

FIGS. 4 and 5 depict a MCPCB fixture 200, according to an embodiment. Elements depicted in FIGS. 4 and 5 may be described above, and for the sake of brevity an additional description of these elements is omitted.

As depicted by FIG. 4, hinge 270 may allow first bracket 210 and/or second bracket 220 to rotate relative to one another.

As depicted in FIG. 5, responsive to rotating first bracket 210 relative to second bracket 220, the ends of the bends associated with the first set of MCPCBs 110 may be positioned adjacent to the ends of the bends associated with the second set of MCPCBs 110. Furthermore, the lower surfaces of first bracket 210 may be positioned adjacent or proximate to the lower surface of second bracket 220. This may minimize the profile occupied by system 200. Furthermore, by positioning the ends of MCPCBs 110 adjacent to each other, the light sources associated with the MCPCBs 110 may be protected. In further embodiments, hinge 270 may include a lock, which allows system 100 to be releasably positioned in the first extended mode, or the second folded mode.

Figure 6:
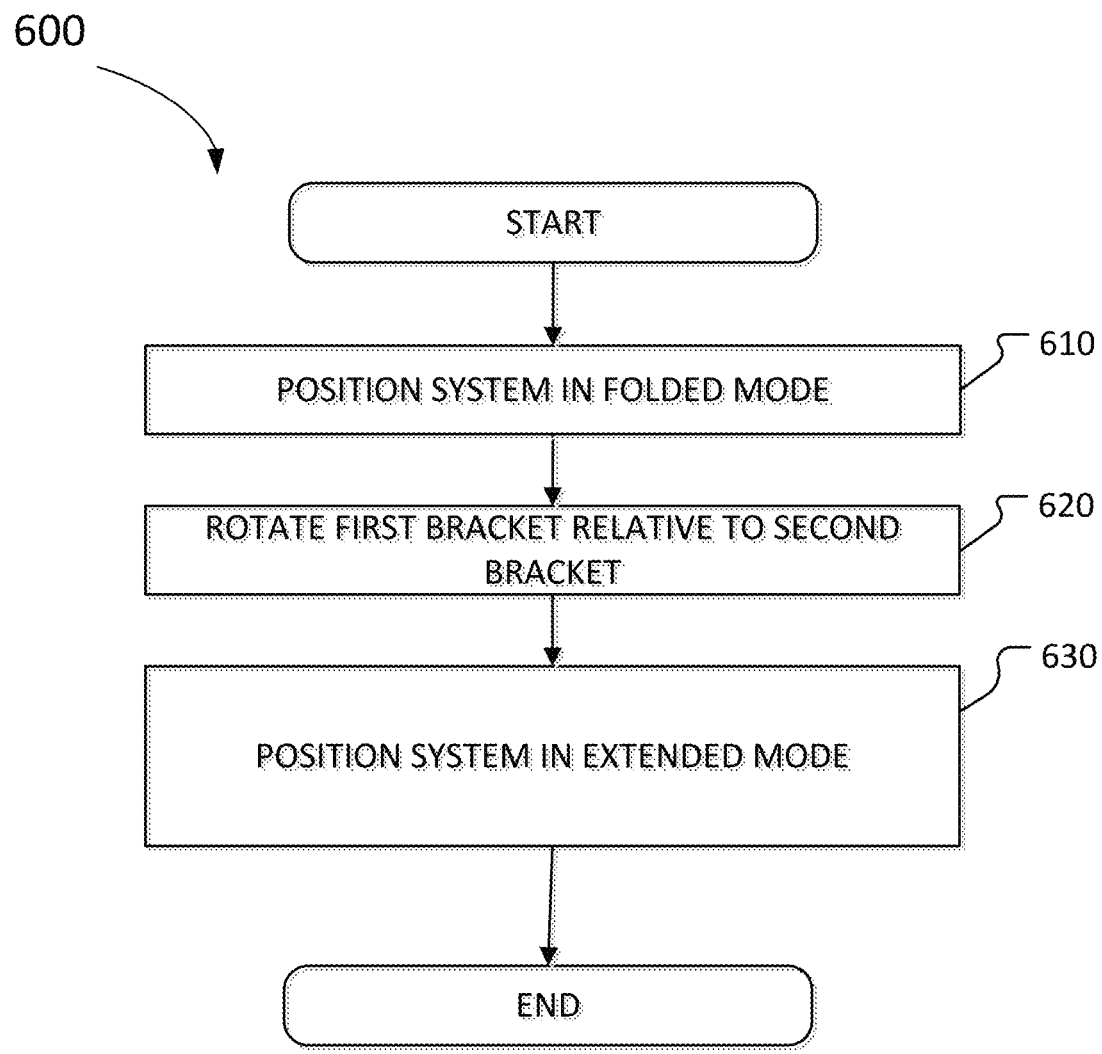
FIG. 6 depicts a method of utilizing a light fixture, according to an embodiment.

FIG. 6 illustrates a method 600 for utilizing a bracketed light fixture, according to an embodiment. The operations of method 600 presented below are intended to be illustrative. In some embodiments, method 600 may be accomplished with one or more additional operations not described, and/or without one or more of the operations discussed. Additionally, the order in which the operations of method 600 are illustrated in FIG. 6 and described below is not intended to be limiting.

At operation 610, a bracketed light fixture may be positioned in a folded mode. In the folded mode, a first set of bent panels may be rotated about a hinge to be positioned adjacent to a second set of bent panels. In the folded mode, the body of the bent panels may shield their associated light sources from the elements. This may assist in protecting the light sources during transportation and installation.

At operation 620, the first set of bent panels may be rotated around the hinge.

At operation 630, the first set of bent panels may be positioned in an extended mode, such that the first set of bent panels are in the same plane as the second set of bent panels.

Although the present technology has been described in detail for the purpose of illustration based on what is currently considered to be the most practical and preferred implementations, it is to be understood that such detail is solely for that purpose and that the technology is not limited to the disclosed implementations, but, on the contrary, is intended to cover modifications and equivalent arrangements that are within the spirit and scope of the appended claims. For example, it is to be understood that the present technology contemplates that, to the extent possible, one or more features of any implementation can be combined with one or more features of any other implementation.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or sub-combinations in one or more embodiments or examples. In addition, it is appreciated that the figures provided herewith are for explanation purposes to persons ordinarily skilled in the art and that the drawings are not necessarily drawn to scale.

The flowcharts and block diagrams in the flow diagrams illustrate the architecture, functionality, and operation of possible implementations of systems, methods, and computer program products according to various embodiments of the present invention. In this regard, each block in the flowcharts or block diagrams may represent a module, segment, or portion of code, which comprises one or more executable instructions for implementing the specified logical function(s). It will also be noted that each block of the block diagrams and/or flowchart illustrations, and combinations of blocks in the block diagrams and/or flowchart illustrations, may be implemented by special purpose hardware-based systems that perform the specified functions or acts, or combinations of special purpose hardware and computer instructions.

What is claimed is:

1. A light fixture, comprising:
a plurality of light bars, wherein each light bar comprises:
a substrate having at least one bend extending along an entire length of the light bar; and
a plurality of light sources directly embedded on the substrate; and
a bracket connected orthogonally to each of the plurality of light bars, wherein a width of the bracket is smaller than the entire length of the light bar;
wherein the bracket comprises:
a first rail on a first side of the bracket, extending along a longitudinal axis of the bracket;
a second rail on a second side of the bracket, extending along the longitudinal axis of the bracket; and
a channel defined by the first rail and the second rail extending along the longitudinal axis of the bracket.

2. The light fixture of claim 1, wherein the substrate comprises a metal core printed circuit board.

3. The light fixture of claim 1, wherein the at least one bend operates as a heat sink.

4. The light fixture of claim 1, wherein upper ends of the first rail and the second rail are vertically offset from an upper surface of the channel.

5. The light fixture of claim 1, wherein heat generated by the plurality of light sources is directed towards the longitudinal axis of the bracket by the first rail and the second rail.

6. A light fixture, comprising:
   a plurality of light bars, wherein each light bar comprises:
      a substrate having at least one bend extending along an entire length of the light bar; and
      a plurality of light sources directly embedded on the substrate; and
   a bracket connected orthogonally to each of the plurality of light bars, wherein a width of the bracket is smaller than the entire length of the light bar and wherein the bracket comprises a plurality of coupling orifices that allow the plurality of light bars to be connected to the bracket.

7. A light fixture, comprising:
   a plurality of light bars, wherein each light bar comprises:
      a substrate having at least one bend extending along an entire length of the light bar; and
      a plurality of light sources directly embedded on the substrate; and
   a bracket connected orthogonally to each of the plurality of light bars, wherein a width of the bracket is smaller than the entire length of the light bar and wherein the bracket comprises a plurality of cutouts configured to receive upper surfaces of each of the plurality of light bars.

8. The light fixture of claim 7, wherein when the plurality of light bars are positioned within the plurality of cutouts, a bottom surface of each cutout is flush with a bottom surface of each of the plurality of light bars.

9. A lighting system, comprising:
   a first light fixture and a second light fixture, wherein each of the first light fixture and the second light fixture comprises:
      a plurality of light bars, wherein each light bar comprises:
         a substrate having at least one bend extending along an entire length of the light bar; and
         a plurality of light sources directly embedded on the substrate; and
      a bracket connected orthogonally to each of the plurality of light bars, wherein a width of the bracket is smaller than the entire length of the light bar; and
   a hinge that connects the bracket of the first light fixture to the bracket of the second light fixture.

10. The lighting system of claim 9, wherein in an extended mode first hinge is extended such that the first light fixture is positioned in a same plane as the second light fixture.

11. The lighting system of claim 9, wherein in a folded mode the hinge is folded such that the first light fixture is positioned adjacent and parallel to the second light fixture.

12. The lighting system of claim 9, wherein the first light fixture comprises a first number of light bars and the second light fixture comprises a second number of light bars different from the first number.

\* \* \* \* \*